(12) United States Patent
Noguchi et al.

(10) Patent No.: US 11,139,378 B2
(45) Date of Patent: Oct. 5, 2021

(54) SEMICONDUCTOR DEVICE

(71) Applicant: TOSHIBA MEMORY CORPORATION, Tokyo (JP)

(72) Inventors: Masaki Noguchi, Yokkaichi Mie (JP); Tatsunori Isogai, Yokkaichi Mie (JP); Tomonori Aoyama, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/556,034

(22) Filed: Aug. 29, 2019

(65) Prior Publication Data
US 2020/0295201 A1    Sep. 17, 2020

(30) Foreign Application Priority Data
Mar. 14, 2019   (JP) .............. JP2019-047559

(51) Int. Cl.
| H01L 21/28 | (2006.01) |
| H01L 29/792 | (2006.01) |
| H01L 29/66 | (2006.01) |
| H01L 27/11578 | (2017.01) |
| H01L 27/1157 | (2017.01) |

(52) U.S. Cl.
CPC .... *H01L 29/40117* (2019.08); *H01L 27/1157* (2013.01); *H01L 27/11578* (2013.01); *H01L 29/66833* (2013.01); *H01L 29/792* (2013.01)

(58) Field of Classification Search
CPC .......... H01L 29/792; H01L 29/66833; H01L 29/40117; H01L 29/7926; H01L 29/511; H01L 29/513; H01L 27/11578; H01L 27/1157; H01L 27/11582; H01L 27/11568; H01L 27/11556
See application file for complete search history.

(56) References Cited

U.S. PATENT DOCUMENTS

| 8,674,430 | B2 | 3/2014 | Yasuda | |
|---|---|---|---|---|
| 9,437,607 | B2 | 9/2016 | Park | |
| 9,443,866 | B1* | 9/2016 | Sakakibara | ....... H01L 27/11565 |
| 9,882,018 | B2 | 1/2018 | Noh | |
| 2008/0173930 | A1 | 7/2008 | Watanabe | |
| 2009/0020805 | A1 | 1/2009 | Heo | |
| 2010/0157680 | A1* | 6/2010 | Higuchi | ........... H01L 29/40117 365/185.18 |
| 2013/0062685 | A1* | 3/2013 | Yasuda | ............... H01L 29/7926 257/325 |
| 2014/0073099 | A1* | 3/2014 | Park | .................. H01L 27/11556 438/268 |
| 2014/0286098 | A1 | 9/2014 | Yasuda | |

(Continued)

*Primary Examiner* — Errol V Fernandes
*Assistant Examiner* — Jeremy J Joy
(74) *Attorney, Agent, or Firm* — Foley & Lardner LLP

(57) ABSTRACT

According to one embodiment, a semiconductor device includes a semiconductor layer, a charge storage layer provided on the surface of the semiconductor layer via a first insulating film, and an electrode layer provided on the surface of the charge storage layer via a second insulating film. The first insulating film includes a first region where the compositional ratio of nitrogen to silicon, oxygen and nitrogen varies from a first value to a second value, which is lower than the first value, along a first direction from the semiconductor layer toward the charge storage layer.

13 Claims, 3 Drawing Sheets

(56) References Cited

U.S. PATENT DOCUMENTS

| | | | |
|---|---|---|---|
| 2015/0194440 A1* | 7/2015 | Noh | H01L 27/11582 257/324 |
| 2016/0043179 A1* | 2/2016 | Noh | H01L 27/11582 257/315 |
| 2016/0118398 A1* | 4/2016 | Yon | H01L 29/511 257/314 |

* cited by examiner

SEMICONDUCTOR DEVICE

CROSS-REFERENCE TO RELATED APPLICATION(S)

This application is based upon and claims the benefit of priority from Japanese Patent Application No. 2019-047559, filed Mar. 14, 2019, the entire contents of which are incorporated herein by reference.

FIELD

Embodiments described herein relate generally to a semiconductor device.

BACKGROUND

An insulating film (tunnel insulating film), provided between a charge storage layer and a channel semiconductor layer in a semiconductor memory, is generally comprised of a silicon oxide film. However, it is desirable if a tunnel insulating film having a different structure can have an enhanced performance.

Examples of related art include U.S. Patent Application Publication No. 2014/0286098 and U.S. Pat. No. 8,674,430.

DETAILED DESCRIPTION

Embodiments provide a semiconductor device which can enhance the performance of an insulating film between a charge storage layer and a semiconductor layer.

In general, according to one embodiment, a semiconductor device includes a semiconductor layer, a first insulating film, a charge storage layer provided on the semiconductor layer via the first insulating film, a second insulating film, and an electrode layer provided on the charge storage layer via the second insulating film. The first insulating film includes a first surface facing the semiconductor layer and a second surface facing the electrode layer. The first insulating film includes a first region with a compositional ratio of nitrogen to silicon, oxygen and nitrogen varying between a first value and a second value along a first direction from the first surface toward the second surface. The first second value is greater than the second value.

Figure 1:
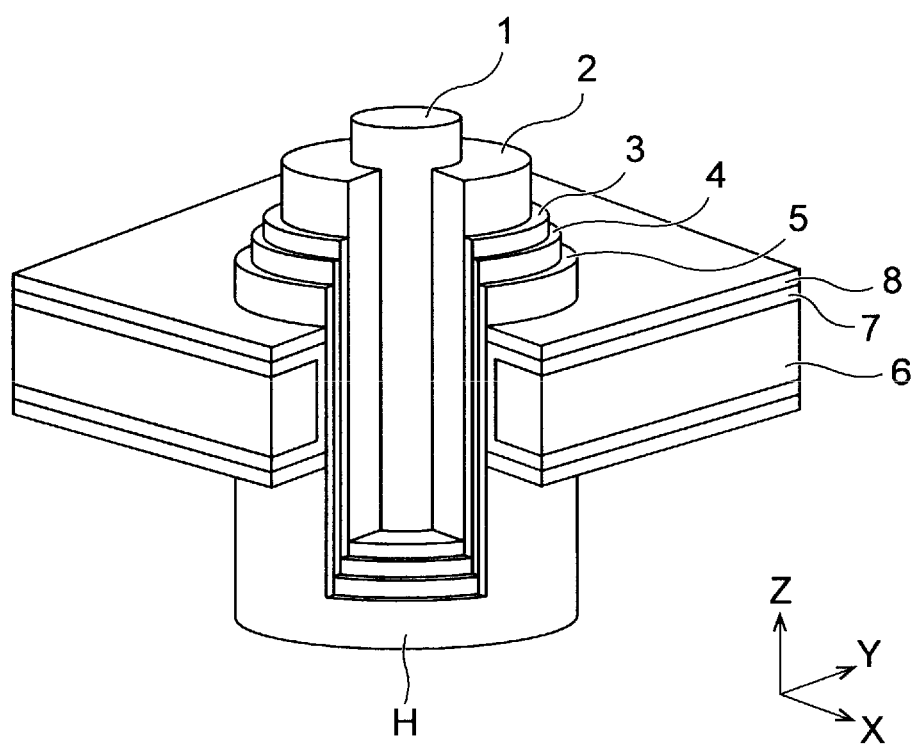
FIG. 1 is a perspective view showing the structure of a semiconductor device according to a first embodiment.

Embodiments of the present disclosure will now be described with reference to the drawings. In FIGS. 1 through 3, the same symbols are used for the same or similar components or elements, and a duplicate description thereof is omitted.

First Embodiment

FIG. 1 is a perspective view showing the structure of a semiconductor device according to a first embodiment. The semiconductor device of FIG. 1 is, for example, a three-dimensional NAND memory.

The semiconductor device of FIG. 1 includes a core insulating film 1, a channel semiconductor layer 2, a tunnel insulating film 3, a charge storage layer 4, a block insulating film 5, an electrode material layer 6, a first metal layer 7, and a second metal layer 8. The tunnel insulating film 3 is an example of a first insulating film, and the block insulating film 5 is an example of a second insulating film.

Referring to FIG. 1, a plurality of electrode layers and a plurality of insulating layers are stacked alternately on a substrate, and a memory hole H is provided such that it penetrates the electrode layers and the insulating layers. Each electrode layer is composed of the electrode material layer 6, etc. and functions as a gate electrode (word line). FIG. 1 shows an X direction and a Y direction which are parallel to the surface of the substrate and perpendicular to each other, and a Z direction perpendicular to the surface of the substrate. A +Z direction is herein treated as an upward direction, and a −Z direction as a downward direction. The −Z direction may or may not coincide with the direction of gravitational force.

The core insulating film 1, the channel semiconductor layer 2, the tunnel insulating film 3, the charge storage layer 4 and the block insulating film 5 are formed in the memory hole H and constitute a memory cell. In particular, the block insulating film 5 is formed on the surfaces of the electrode layers and the insulating layers, exposed in the memory hole, and the charge storage layer 4 is formed on the surface of the block insulating film 5. The charge storage layer 4 can store electric charge between one side surface (outer peripheral surface) and the other side surface (inner peripheral surface). The tunnel insulating film 3 is formed on the surface of the charge storage layer 4, and the channel semiconductor layer 2 is formed on the surface of the tunnel insulating film 3. The channel semiconductor layer 2 functions as a channel of the memory cell. The core insulating film 1 is formed inside the channel semiconductor layer 2.

The block insulating film 5 is, for example, a stacked film including an $Al_2O_3$ film (aluminum oxide film) and an $SiO_2$ film (silicon oxide film). The charge storage layer 4 is, for example, an SiN film (silicon nitride film). The tunnel insulating film 3 is, for example, a stacked film including an $SiO_2$ film and an SiON film (silicon oxynitride film). The details of the tunnel insulating film 3 will be described later. The channel semiconductor layer 2 is, for example, a polysilicon layer. The core insulating film 1 is, for example, an $SiO_2$ film.

The electrode material layer 6, the first metal layer 7 and the second metal layer 8 are, for example, a W layer (tungsten layer), a TiN film (titanium nitride film) and an $Al_2O_3$ film, respectively. In this case, the first metal layer 7 functions as a barrier metal layer in the electrode layer, and the second metal layer 8 functions as a block insulating film together with the block insulating film 5.

Figure 2A:
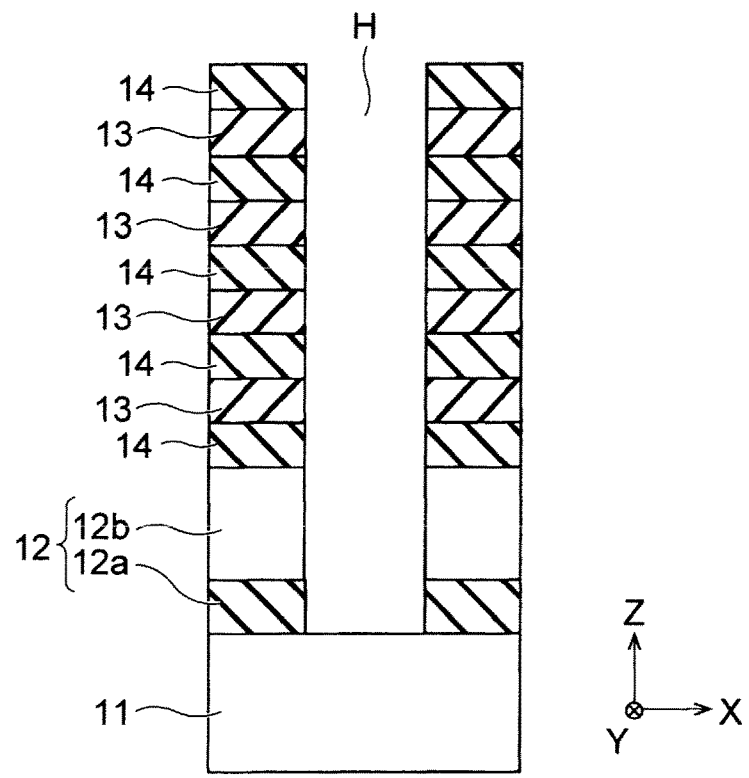
FIGS. 2A and 2B are cross-sectional views illustrating a method for manufacturing the semiconductor device according to the first embodiment.
Figure 2B:
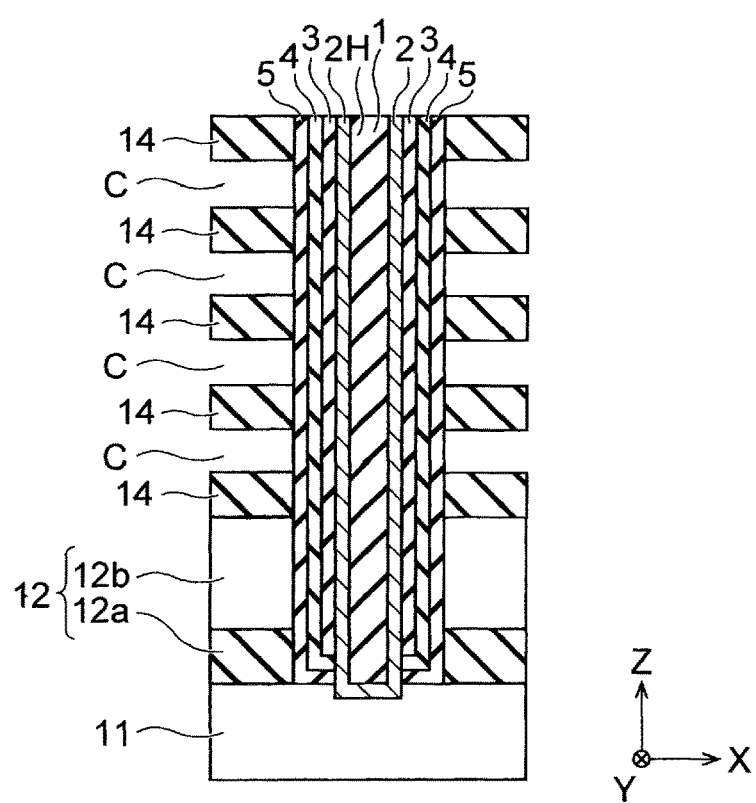
Figure 3:
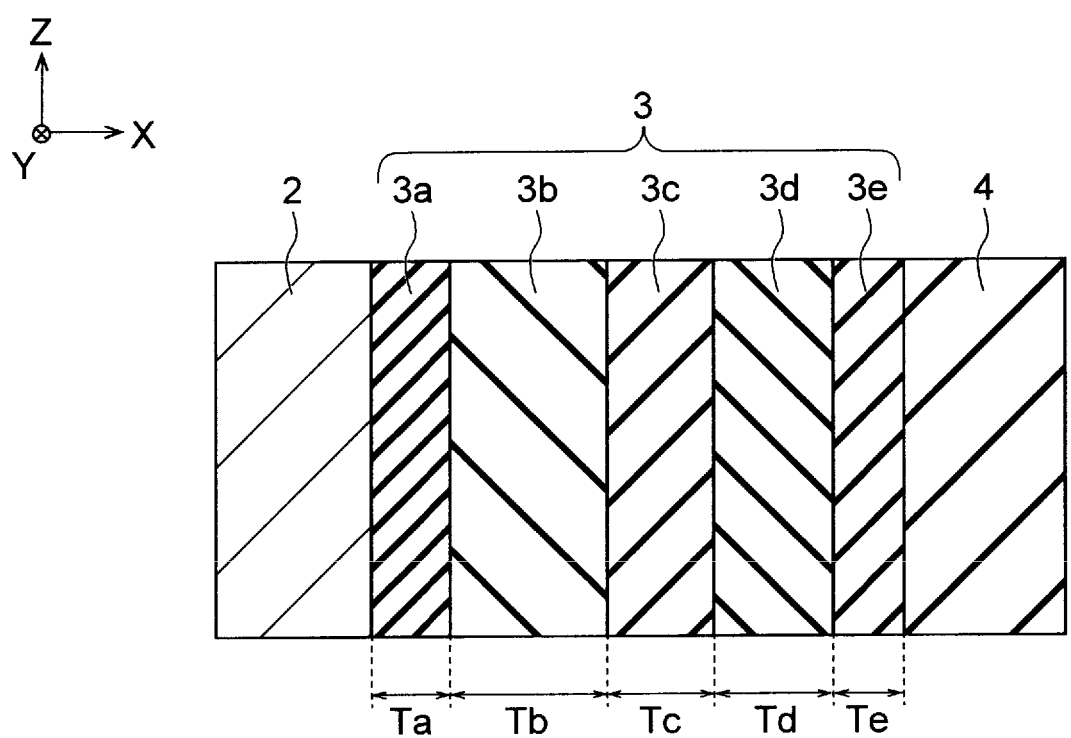
FIG. 3 is a cross-sectional view showing the structure of the semiconductor device according to the first embodiment.

FIGS. 2A and 2B are cross-sectional views illustrating a method for manufacturing the semiconductor device according to the first embodiment.

First, an underlayer 12 is formed on a substrate 11, and a plurality of sacrificial layers 13 and a plurality of insulating layers 14 are formed alternately on the underlayer (FIG. 2A). Next, a memory hole H, penetrating the underlayer 12, the sacrificial layers 13 and the insulating layers 14, is formed (FIG. 2A).

The substrate 11 is, for example, a semiconductor substrate such as a silicon substrate. The underlayer 12 is, for example, a stacked film including an interlayer insulating film 12a provided on the substrate 11, and a semiconductor layer 12b provided on the interlayer insulating film 12a. An SiO$_2$ film or an SiN film is an example of the interlayer insulating film 12a. A polysilicon layer is an example of the semiconductor layer 12b. Each sacrificial layer 13 is, for example, an SiN film. Each insulating layer 14 is, for example, an SiO$_2$ film.

In this embodiment, a plurality of cavities are formed between the insulating layers 14 by removing the sacrificial layers 13, and then a second metal layer 8, a first metal layer 7 and an electrode material layer 6 are sequentially formed in each cavity, as will be described below. As a result, the above-described electrode layers are formed in the cavities. This process is termed a replacement process. In the case of not using such a replacement process, the electrode layers are formed instead of the sacrificial layers 13 in the process step of FIG. 2A.

Next, a block insulating film 5, a charge storage layer 4, a tunnel insulating film 3 and a channel semiconductor layer 2 are sequentially formed on the surfaces of the underlayer 12, the sacrificial layers 13 and the insulating layers 14, exposed in the memory hole H, and the remainder of the memory hole H is filled with a core insulating film 1 (FIG. 2B). Next, not-shown grooves are formed in the sacrificial layers 13 and the insulating layers 14 and, using the grooves, the sacrificial layers 13 are etched away with a liquid chemical such as phosphoric acid. As a result, cavities C are formed between the insulating layers 14 (FIG. 2B).

In particular, the block insulating film 5, the charge storage layer 4, the tunnel insulating film 3, the channel semiconductor layer 2 and the core insulating film 1 are formed in the following manner. First, the block insulating film 5, the charge storage layer 4 and the tunnel insulating film 3 are sequentially formed on the surfaces of the underlayer 12, the sacrificial layers 13 and the insulating layers 14, exposed in the memory hole H. Next, the block insulating film 5, the charge storage layer 4 and the tunnel insulating film 3 are etched away from the bottom of the memory hole H, whereby the substrate 11 becomes exposed in the memory hole H. Next, the channel semiconductor layer 2 and the core insulating film 1 are sequentially formed in the memory hole H.

Thereafter, the second metal layer 8, the first metal layer 7 and the electrode material layer 6 are sequentially formed in each cavity C (see FIG. 1). As a result, the above-described electrode layers are formed in the cavities C. The semiconductor device of FIG. 1 is thus manufactured. The underlayer 12b may also be formed by first forming a sacrificial layer, and removing the sacrificial layer and forming a polysilicon layer by a replacement process.

FIG. 3 is a cross-sectional view showing the structure of the semiconductor device according to the first embodiment. FIG. 3 shows an XZ cross-section passing through the central axis of the memory hole H of FIG. 1.

As shown in FIG. 3, the tunnel insulating film 3 of this embodiment includes an SiO$_2$ film 3a, an SiON film 3b, an SiON film 3c, an SiON film 3d and an SiO$_2$ film 3e, which are provided in this order on the surface of the channel semiconductor layer 2. The SiON film 3c is an example of a first region. The SiON film 3b is an example of a second region, and the SiON film 3d is an example of a third region. The SiO$_2$ film 3a and the SiO$_2$ film 3e are examples of an oxide film. The symbols Ta, Tb, Tc, Td and Te represent the thicknesses of the SiO$_2$ film 3a, the SiON film 3b, the SiON film 3c, the SiON film 3d and the SiO$_2$ film 3e, respectively. The SiO$_2$ film 3a, the SiON film 3b, the SiON film 3c, the SiON film 3d and the SiO$_2$ film 3e of this embodiment all have a cylindrical (circular tube-like) shape. The thickness of the tunnel insulating film 3 may be not less than 5.0 nm and not more than 6.0 nm, for example 6.0 nm.

The compositional ratio of nitrogen to silicon, oxygen and nitrogen in the SiON film 3c will now be described. When the SiON film 3c is expressed by the compositional formula $Si_{1-X-Y}O_XN_Y$, the Y corresponds to the compositional ratio of nitrogen. The following description illustrates variation in the compositional ratio of nitrogen in the SiON film 3c in a direction extending radially from the central axis of the memory hole H. The direction is an example of a first direction from the channel semiconductor layer 2 toward the charge storage layer 4. The +X direction shown in FIG. 3 is an example of the first direction. The compositional ratio of nitrogen in the SiON films 3b, 3d will also be described.

The compositional ratio of nitrogen in the SiON film 3c varies from a first value (e.g. 30%) to a second value (e.g. 10%) along a direction extending radially from the central axis of the memory hole H. In particular, the compositional ratio of nitrogen in the SiON film 3c is 30% in the vicinity of the boundary with the SiON film 3b, and 10% in the vicinity of the boundary with the SiON film 3d; the compositional ratio of nitrogen in the SiON film 3c decreases at a constant decrease rate in a direction from the SiON film 3b toward the SiON film 3d. Thus, in the XZ cross-section of FIG. 3, the compositional ratio of nitrogen in the SiON film 3c varies from 30% to 10% in the +X direction.

The first value may be a value other than 30%, and the second value may be a value other than 10%. The first value of this embodiment is not less than 25% and not more than 35%. The second value of this embodiment is not less than 5% and not more than 15%.

The compositional ratio of nitrogen in the SiON film 3b has the first value (e.g. 30%) along a direction extending radially from the central axis of the memory hole H. In this embodiment, the value of the compositional ratio of nitrogen in the SiON film 3b is approximately constant (at 30%) throughout the SiON film 3b. The thickness Tb of the SiON film 3b may be not less than 1.0 nm and not more than 3.0 nm, for example 2.5 nm.

The compositional ratio of nitrogen in the SiON film 3d has the second value (e.g. 10%) along a direction extending radially from the central axis of the memory hole H. In this embodiment, the value of the compositional ratio of nitrogen in the SiON film 3d is approximately constant (at 10%) throughout the SiON film 3d. The thickness Td of the SiON film 3d may be not less than 0.5 nm and not more than 1.5 nm, for example 1.5 nm.

As described above, the tunnel insulating film 3 of this embodiment includes the region (SiON film 3b) where the compositional ratio of nitrogen is set to the first value, the region (SiON film 3c) where the compositional ratio of nitrogen varies from the first value to the second value, and the region (SiON film 3d) where the compositional ratio of nitrogen is set to the second value. The advantages of such a structure will be described later. The SiON films 3b to 3d may each further contain an element(s) other than silicon, oxygen and nitrogen. The tunnel insulating film 3 may have a structure including the SiON film 3c and not including the SiON films 3b, 3d.

The SiO$_2$ film 3a is formed between the channel semiconductor layer 2 and the SiON film 3b. This can avoid contact of the channel semiconductor layer 2 with the nitrogen-containing film. However, the SiO$_2$ film 3a may contain nitrogen as an impurity element. Instead of the SiO$_2$ film 3a, an oxide film other than an SiO$_2$ film may be formed between the channel semiconductor layer 2 and the SiON film 3b. The tunnel insulating film 3 may have a structure not including the SiO$_2$ film 3a.

The SiO$_2$ film 3e is formed between the charge storage layer 4 and the SiON film 3d. This makes it possible to improve the charge retention characteristics of the charge storage layer 4 from the viewpoint of the band structure. The SiO$_2$ film 3e may contain nitrogen as an impurity element. Instead of the SiO$_2$ film 3e, an oxide film other than an SiO$_2$ film may be formed between the charge storage layer 4 and the SiON film 3d. The tunnel insulating film 3 may have a structure not including the SiO$_2$ film 3e.

In this embodiment, the thickness Ta of the SiO$_2$ film 3a, the thickness Tc of the SiON film 3c and the thickness Te of the SiO$_2$ film 3e are determined after determining the thickness of the tunnel insulating film 3, the thickness Tb of the SiON film 3b and the thickness Td of the SiON film 3d. For example, when the thickness of the tunnel insulating film 3 is set to 6.0 nm, the thickness Tb of the SiON film 3b is set to 2.5 nm, and the thickness Td of the SiON film 3d is set to 1.5 nm, then the thickness "Ta+Tc+Te" is set to 2.0 nm. In this case, Ta is set to e.g. 0.5 nm, Tc is set to e.g. 1.0 nm, and Te is set to e.g. 0.5 nm.

The SiON film 3c of this embodiment can be formed, for example, in the following manner.

The SiON film 3c is formed, for example, by ALD (Atomic Layer Deposition). When forming the SiON film 3c on the substrate 11, hexachlorodisilane (HCD: Si$_2$Cl$_6$) gas as an Si material gas, oxygen (O$_2$) gas as an oxidizing agent, and ammonia (NH$_3$) gas as a nitriding agent are supplied into a vertical low-pressure film-forming furnace in which the substrate 11 is housed. In this embodiment, the SiON film 3c is formed by repeating a processing cycle, comprising supplying Si$_2$Cl$_6$ gas, O$_2$ gas and NH$_3$ gas sequentially, a plurality of times. The thickness Tc of the SiON film 3c can be controlled by adjusting the number of the processing cycles repeated.

It is possible to use other gas containing Si and Cl as an Si material gas. Examples of such gases include dichlorosilane (DCS) gas, tetrachlorosilane (TCS) gas and trichlorosilane (TrisCS) gas. Any of Si$_2$Cl$_6$ gas, O$_2$ gas and NH$_3$ gas may be supplied first in each ALD cycle.

When depositing the SiON film 3c, the temperature in the furnace is set, for example, to 700° C. and the pressure in the furnace is set, for example, depending on vacuuming conditions. The gas flow times for Si$_2$Cl$_6$ gas, O$_2$ gas and NH$_3$ gas are set so that the SiON film 3c having a uniform thickness Tc can be deposited in the memory hole H. The flow rates of the gases are controlled by an MFC (Mass Flow Controller). For example, the flow rate and the partial pressure of Si$_2$Cl$_6$ gas are controlled at 0.1 to 0.3 slm and 5 to 15 Pa, the flow rate and the partial pressure of O$_2$ gas are controlled at 0.5 to 10 slm and 5 to 40 Pa, and the flow rate and the partial pressure of NH$_3$ gas are controlled at 0.5 to 10 slm and 1 to 40 Pa.

In this embodiment, the tunnel insulating film 3 is formed on the surface of the charge storage layer 4 by sequentially forming the SiO$_2$ film 3e, the SiON film 3d, the SiON film 3c, the SiON film 3b and the SiO$_2$ film 3a on the surface of the charge storage layer 4. Accordingly, the SiON film 3c is formed on the surface of the SiON film 3d.

As described above, the compositional ratio of nitrogen in the SiON film 3c of this embodiment varies from 30% to 10% along a direction extending radially from the central axis of the memory hole H. Such an SiON film 3c can be formed, for example, by controlling the feed rates of Si$_2$Cl$_6$ gas, O$_2$ gas and NH$_3$ gas so that the SiON film 3c being deposited has a low nitrogen concentration at the start of deposition of the SiON film 3c, and has a high nitrogen concentration at the end of deposition of the SiON film 3c.

During deposition of the SiON film 3c of this embodiment, the flow rate of Si$_2$Cl$_6$ gas and the gas flow time in each cycle are controlled at constant values. The flow rate of O$_2$ gas and the gas flow time in each cycle are controlled so that the oxygen concentration in the SiON film 3c being deposited gradually decreases. The flow rate of NH$_3$ gas and the gas flow time in each cycle are controlled so that the nitrogen concentration in the SiON film 3c being deposited gradually increases. This method can form the SiON film 3c in which the compositional ratio of nitrogen increases at a constant increase rate in a direction from the SiON film 3d toward the SiON film 3b. The silicon concentration (compositional ratio of silicon) in the SiON film 3c, formed by this method, is approximately constant throughout the SiON film 3c.

The SiON film 3b and the SiON film 3d can be formed by the same method as the SiON film 3c. However, as with the flow rate of Si$_2$Cl$_6$ gas and the gas flow time in each cycle, the flow rate of O$_2$ gas and the gas flow time in each cycle as well as the flow rate of NH$_3$ gas and the gas flow time in each cycle are controlled at a constant value.

Further details of the tunnel insulating film 3 of this embodiment will now be described.

From the viewpoints of band engineering and dielectric constant, it is conceivable to use as the tunnel insulating film 3 an SiO$_2$ film or a stacked film including an SiO$_2$ film and an SiON film. In the latter case, an increase in the nitrogen concentration in the SiON film reduces the barrier height with a channel semiconductor layer 2 for electrons and holes, leading to a reduction in the tunnel distance upon injection of electrons and holes. This enhances the reading efficiency and erasing efficiency of a memory cell. On the other hand, an increase in the nitrogen concentration at the interface between the charge storage layer 4 and the tunnel insulating film 3 reduces the difference in the barrier height for electrons. Therefore, electrons are likely to escape toward the channel semiconductor layer 2, resulting in deterioration of the charge retention characteristics of the charge storage layer 4. An increase in the nitrogen concentration in the SiON film thus results in a tradeoff between enhancement of the writing efficiency and the erasing efficiency and deterioration of the charge retention characteristics.

On the other hand, the tunnel insulating film 3 of this embodiment includes the SiON film 3c in which the compositional ratio of nitrogen in the SiON film 3c varies from the first value (e.g. 30%) to the second value (e.g. 10%) along a direction extending radially from the central axis of the memory hole H.

The nitrogen concentration in the SiON film 3c increases by setting the first value to a high value. This can enhance the writing efficiency and the erasing efficiency. The nitrogen concentration at the interface between the charge storage layer 4 and the tunnel insulating film 3 decreases by setting the second value to a low value. This can prevent deterioration of the charge retention characteristics. Thus, according to this embodiment, it becomes possible to alleviate the above-described tradeoff.

For the tunnel insulating film 3 of this embodiment, a band calculation was performed during a writing operation, during an erasing operation and during retention of electric charge. The calculation revealed a short tunnel distance during the writing operation and during the erasing operation, and a long tunnel distance during retention of electric charge. Therefore, the thickness Tb of the SiON film 3b is preferably set to be relatively large, for example, not less than 1.0 nm and not more than 3.0 nm. On the other hand, the thickness Td of the SiON film 3d is preferably set to be relatively small, for example, not less than 0.5 nm and not more than 1.5 nm.

As described hereinabove, the tunnel insulating film 3 of this embodiment includes the SiON film 3c in which the compositional ratio of nitrogen in the SiON film 3c varies from the first value to the second value, which is lower than the first value, along a direction extending radially from the central axis of the memory hole H. According to this embodiment, the tunnel insulating film 3 can have an enhanced performance, such as enhanced writing efficiency and erasing efficiency without deterioration of the charge retention characteristics.

The nitrogen concentration (compositional ratio of nitrogen) in the tunnel insulating film 3 of this embodiment may vary not only in the SiON film 3c but also in the SiON film 3b in an area near the silicon oxide film 3a, or in the SiON film 3d in an area near the silicon oxide film 3e. For example, the nitrogen concentration in the SiON film 3b, in an area near the silicon oxide film 3a, may decrease in a direction toward the silicon oxide film 3a.

This embodiment is also applicable to a two-dimensional NAND memory. In that case, a memory cell is formed by sequentially forming a tunnel insulating film 3, a charge storage layer 4, a block insulating film 5, and an electrode material layer 6 on the upper surface of a substrate 11. The substrate 11 functions as a channel semiconductor layer, and the electrode material layer 6 functions as a gate electrode (word line).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor layer;
   a first insulating film surrounding the semiconductor layer;
   a charge storage layer surrounding the semiconductor layer via the first insulating film;
   a second insulating film; and
   an electrode layer surrounding the charge storage layer via the second insulating film,
   wherein the first insulating film includes a first oxide film contacting the semiconductor layer via a first surface a second oxide film contacting the charge storage layer via a second surface, and an oxynitride film between the first oxide film and the second oxide film,
   wherein the oxynitride film includes a first region with a compositional ratio of nitrogen to silicon, oxygen and nitrogen varying between a first value and a second value along a radial direction from the first surface towards the second surface, and wherein the first value is greater than the second value,
   wherein the oxynitride film further includes a second region provided between the first surface and the first region with a compositional ratio of nitrogen to silicon, oxygen and nitrogen being the first value,
   wherein the oxynitride film further includes a third region provided between the second surface and the first region with a compositional ratio of nitrogen to silicon, oxygen and nitrogen being the second value; and
   wherein a width of the second region in the radial direction is greater than a width of the third region in the radial direction.

2. The semiconductor device according to claim 1, wherein the width of the second region is not less than 1.0 nanometer (nm) and not greater than 3.0 nm.

3. The semiconductor device according to claim 1, wherein the width of the third region is not less than 0.5 nm and not greater than 1.5 nm.

4. The semiconductor device according to claim 1, wherein the first value is not less than 25% and not greater than 35%.

5. The semiconductor device according to claim 1, wherein the second value is not less than 5% and not greater than 15%.

6. The semiconductor device according to claim 1, wherein the electrode layer includes a plurality of electrode layers alternately provided with a plurality of insulating layers.

7. The semiconductor device according to claim 1, wherein the width of the first region is smaller than the width of the second region.

8. The semiconductor device according to claim 1, wherein the width of the first region is smaller than the width of the third region.

9. A method, comprising:
   forming a hole extending through a plurality of alternatively stacked sacrificial layers and insulating layers along a first direction;
   sequentially forming a second insulating film, a charge storage layer, and a first insulating film over the hole; and
   forming a semiconductor layer over the first insulating film to extend through the hole;
   wherein the first insulating film includes a first oxide contacting the semiconductor layer via a first surface a second oxide film contacting the charge storage layer via a second surface, and an oxynitride film between the first oxide and second oxide,
   wherein the first insulating film includes a first region, a second region, and a third region, the second region provided between the first surface and the first region, the third region provided between the first region and the second surface,
   wherein the second region has a compositional ratio of nitrogen to silicon, oxygen and nitrogen as a second value,
   wherein the third region has a compositional ratio of nitrogen to silicon, oxygen and nitrogen as a first value less than the second value,
   wherein the first region has a compositional ratio of nitrogen to silicon, oxygen and nitrogen varying from the first value to the second value, and
   wherein a width of the second region in a second direction crossing the first direction is greater than a width of the third region in the second direction.

10. The method of claim 9, wherein the first value is not less than 25% and not greater than 35%.

11. The method of claim 9, wherein the second value is not less than 5% and not greater than 15%.

12. The method of claim 9, further comprising:
replacing the plurality of sacrificial layers with a conductive material to form a plurality of electrode layers.

13. A semiconductor device comprising:
a stacked body including a plurality of insulating layers and a plurality of electrode layers that are alternately stacked in a first direction;
a semiconductor layer extending the stacked body in the first direction;
a first insulating film extending the stacked body in the first direction, the first insulating film provided between the semiconductor layer and the stacked body;
a charge storage layer provided on the semiconductor layer via the first insulating film;
a second insulating film provided between the charge storage layer and the stacked body; and
wherein the first insulating film includes a first oxide film contacting the semiconductor layer via a first surface, a second oxide film contacting the charge storage layer via a second surface, and an oxynitride film between the first oxide film and the second oxide film,
wherein the first oxynitride film includes a first region with a compositional ratio of nitrogen to silicon, oxygen and nitrogen varying between a first value and a second value along a second direction from the first surface towards the second surface, and wherein the first value is greater than the second value,
wherein the oxynitride film further includes a second region provided between the first surface and the first region with a compositional ratio of nitrogen to silicon, oxygen and nitrogen being the first value,
wherein the oxynitride film further includes a third region provided between the second surface and the first region with a compositional ratio of nitrogen to silicon, oxygen and nitrogen being the second value; and
wherein a width of the second region in the second direction is greater than a width of the third region in the second direction.

\* \* \* \* \*